(12) United States Patent
Danno

(10) Patent No.: US 7,285,444 B2
(45) Date of Patent: Oct. 23, 2007

(54) METHOD OF MANUFACTURING SEMICONDUCTOR DEVICE

(75) Inventor: Tadatoshi Danno, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 306 days.

(21) Appl. No.: 11/003,361

(22) Filed: Dec. 6, 2004

(65) Prior Publication Data
US 2005/0146058 A1 Jul. 7, 2005

(30) Foreign Application Priority Data
Dec. 26, 2003 (JP) ............................. 2003-431915

(51) Int. Cl.
*H01L 21/44* (2006.01)
*H01L 21/48* (2006.01)
(52) U.S. Cl. ....................... 438/111; 438/112; 438/127; 257/E21.502; 257/E21.506
(58) Field of Classification Search ................ 438/106, 438/110, 111, 112, 121, 123, 124, 127
See application file for complete search history.

(56) References Cited
U.S. PATENT DOCUMENTS

| | | | |
|---|---|---|---|
| 4,971,196 A | | 11/1990 | Kitamura et al. |
| 5,804,468 A | * | 9/1998 | Tsuji et al. ................. 438/122 |
| 5,914,529 A | * | 6/1999 | King et al. .................. 257/666 |
| 6,410,987 B1 | * | 6/2002 | Kanemoto et al. .......... 257/777 |
| 6,427,976 B1 | * | 8/2002 | Huang et al. ................ 257/676 |
| 6,692,991 B2 | * | 2/2004 | Minamio et al. ........... 438/123 |
| 6,774,464 B2 | * | 8/2004 | Sugimori ..................... 257/666 |
| 2004/0070056 A1 | * | 4/2004 | Matsuzawa et al. ........ 257/666 |
| 2004/0114426 A1 | * | 6/2004 | Fee et al. .................... 365/158 |

FOREIGN PATENT DOCUMENTS

JP 2001-77278 3/2001

* cited by examiner

*Primary Examiner*—Scott B. Geyer
(74) *Attorney, Agent, or Firm*—Miles & Stockbridge PC

(57) ABSTRACT

A semiconductor device which includes: a semiconductor chip with plural pads; a tab connected with the semiconductor chip; bus bars which are located outside of the semiconductor chip and connected with the tab; a sealing body which resin-seals the semiconductor chip; plural leads arranged in a line around the semiconductor chip; plural first wires which connect pads of the semiconductor chip and the leads; and plural second wires which connect specific pads of the semiconductor chip and the bus bars. Since the sealing body has a continuous portion which continues from a side surface of the semiconductor chip to its back surface to a side surface of the tab, the degree of adhesion among the semiconductor chip, the tab and the sealing body is increased. This prevents peeling between the tab and the sealing body during a high-temperature process and thus improves the quality of the semiconductor device (QFN).

13 Claims, 13 Drawing Sheets

METHOD OF MANUFACTURING SEMICONDUCTOR DEVICE

CROSS-REFERENCE TO RELATED APPLICATION

The present application claims priority from Japanese patent application No. 2003-431915 filed on Dec. 26, 2003, the content of which is hereby incorporated by reference into this application.

BACKGROUND OF THE INVENTION

The present invention relates to a semiconductor device and a method of manufacturing the same, and more particularly to technology which is effective for a semiconductor device with exposed leads on the back surface of a sealing body.

A conventional semiconductor device consists of a semiconductor chip with multiple input/output pads, a chip mounting plate bonded to the semiconductor chip using an adhesive agent, inner leads with upward burrs at the most remote end from the chip mounting plate, and conductive wires for electrically connecting the input/output pads of the semiconductor chip with the inner leads. Here, the bottoms of the chip mounting plate and inner leads are exposed to the outside. (See Patent Literature 1.)

[Patent Literature 1] Japanese Unexamined Patent Publication No. 2001-77278 (FIG. 1)

SUMMARY OF THE INVENTION

In QFN (Quad Flat Non-leaded Package) semiconductor devices, leads are partially exposed in the peripheral area of the back surface of a sealing body and used as external terminals. In response to demand for a more compact QFN semiconductor device model, a package structure which uses a common GND pin and/or a common power pin to decrease the number of input/output pins has been developed.

In other words, a tab (chip mounting plate) which bears the semiconductor chip is exposed on the back surface of the sealing body and used as a common ground terminal. A protruding part of the tab from the semiconductor chip is connected with plural pads for grounding the semiconductor chip by wires and used as a common ground terminal (this kind of wire bonding is hereinafter called down-bonding). When the QFN semiconductor device is mounted on a board, the tab and the ground terminal of the board are directly connected by soldering.

In the above QFN structure, since sealing resin easily absorbs moisture, a high temperature reflow process for loading solder balls or mounting the QFN on a board, can cause peeling between the tab and resin or between leads and resin. Further, if a temperature cycle test should be conducted in this condition, stress would extend to wire connections of the tab, resulting in increase in the stress at the wire connections. Repeated stress at the wire connections might lead to a wire disconnection.

Consequently, the QFN quality might deteriorate.

An object of the present invention is to provide a semiconductor device which improves quality and a method of manufacturing the same.

Another object of the present invention is to provide a semiconductor device which permits cost reduction and a method of manufacturing the same.

A further object of the present invention is to provide a semiconductor device which improves reflow resistance and a method of manufacturing the same.

The above and further objects and novel features of the invention will more fully appear from the following detailed description and accompanying drawings.

Typical aspects of the invention will be briefly outlined below.

According to one aspect of the invention, a semiconductor device includes: a semiconductor chip which has a main surface, a back surface and side surfaces, and a semiconductor element and a plurality of electrodes which are formed over the main surface; a chip mounting plate which has a main surface, a back surface and side surfaces and is connected with the semiconductor chip; a common lead which is located outside of the semiconductor chip and connected with the chip mounting plate; a sealing body which resin-seals the semiconductor chip; a plurality of leads which are arranged in a line around the semiconductor chip as partially exposed on the back surface of the sealing body; a plurality of first wires which connect the plural electrodes of the semiconductor chip and the corresponding plural leads respectively; and a second wire which connects the electrode of the semiconductor chip and the common lead. The sealing body has a continuous portion which continues from the side surface of the semiconductor chip to its back surface to the side surface of the chip mounting plate.

According to another aspect of the invention, a semiconductor device includes: a semiconductor chip which has a main surface, a back surface and side surfaces, and a semiconductor element and a plurality of electrodes which are formed over the main surface; a chip mounting plate which is connected with the back surface of the semiconductor chip; a connecting portion for connection with the chip mounting plate; a common lead which is located outside of the semiconductor chip and connected with the chip mounting plate through the connecting portion; a sealing body which resin-seals the semiconductor chip; a plurality of leads which are arranged in a line around the semiconductor chip as partially exposed on the back surface of the sealing body; a plurality of first wires which connect the plural electrodes of the semiconductor chip and the corresponding plural leads respectively; and a second wire which connects the electrode of the semiconductor chip and the common lead. The second wire is connected to an area of the common lead other than its intersection with the connecting portion.

According to another aspect of the invention, a method of manufacturing a semiconductor device includes the steps of: preparing a lead frame having a chip mounting plate, a common lead connected with, and located outside of, the chip mounting plate, and a plurality of leads arranged around the chip mounting plate; mounting a semiconductor chip on the chip mounting plate; connecting electrodes of the semiconductor chip with the corresponding leads through first wires; connecting electrodes of the semiconductor chip with the common lead through second wires; forming a sealing body which resin-seals the semiconductor chip and the first wires and the second wires so that a continuous portion of sealing resin which continues from a side surface of the semiconductor chip to its back surface to a side surface of the chip mounting plate is formed and the plural leads are partially exposed on the back surface of the sealing body; and cutting the plural leads from the lead frame to make a separate package.

Main advantageous effects which are brought about by the present invention are as follows.

In the semiconductor device, since the sealing body has a continuous portion which continues from a side surface of the semiconductor chip to its back surface to a side surface of the chip mounting plate, the degree of adhesion among the semiconductor chip, the chip mounting plate and the resin is increased. This prevents peeling between the chip mounting plate and the resin during a high-temperature process. Hence, stress on the common lead in a temperature cycle test is reduced, thereby preventing disconnection in the wire connections of the common lead. The quality of the semiconductor device is thus improved.

DETAILED DESCRIPTION OF THE PREFERRED EMBODIMENTS

Figure 1:
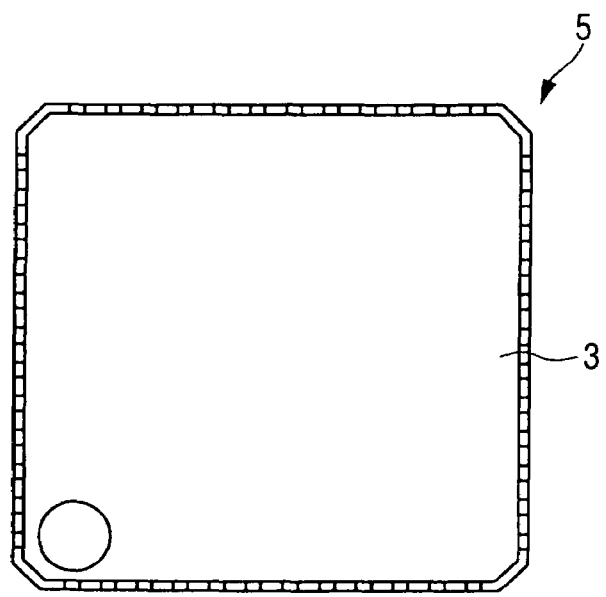
FIG. 1 is a plan view showing a semiconductor device according to a first embodiment of the present invention.

In the explanation of preferred embodiments given below, basically descriptions of like elements will not be repeated except when necessary.

Although preferred embodiments will be described below in different sections or separately on an embodiment-by-embodiment basis, the descriptions are not irrelevant to each other unless otherwise specified. They are, in whole or in part, variations of each other and sometimes one description is a detailed or supplementary form of another.

In the preferred embodiments described below, even when a specific numerical figure (quantity, numerical value, amount, range, etc.) is indicated for an element, it is not limited to the indicated specific numerical figure unless otherwise specified or theoretically limited to the specific numerical figure; it should be understood that it may be larger or smaller than the specific numerical figure.

Next, preferred embodiments of the present invention will be described in detail referring to the accompanying drawings. In all the drawings that illustrate the preferred embodiments, elements with like functions are designated by like reference numerals; and descriptions of these elements will not be repeated.

FIRST EMBODIMENT

The first embodiment of the invention will be described referring to FIGS. 1 to 15.

Figure 2:
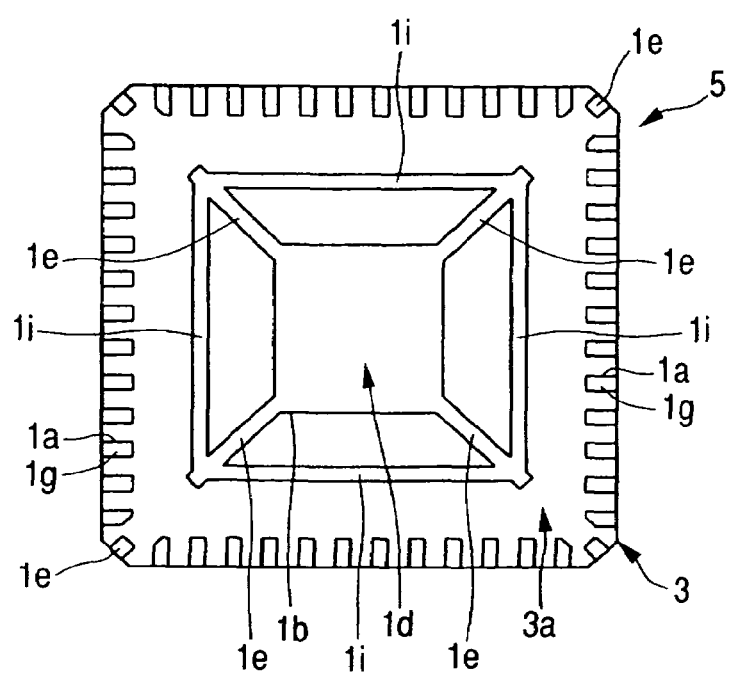
FIG. 2 is a back view showing the semiconductor device of FIG. 1.
Figure 3:
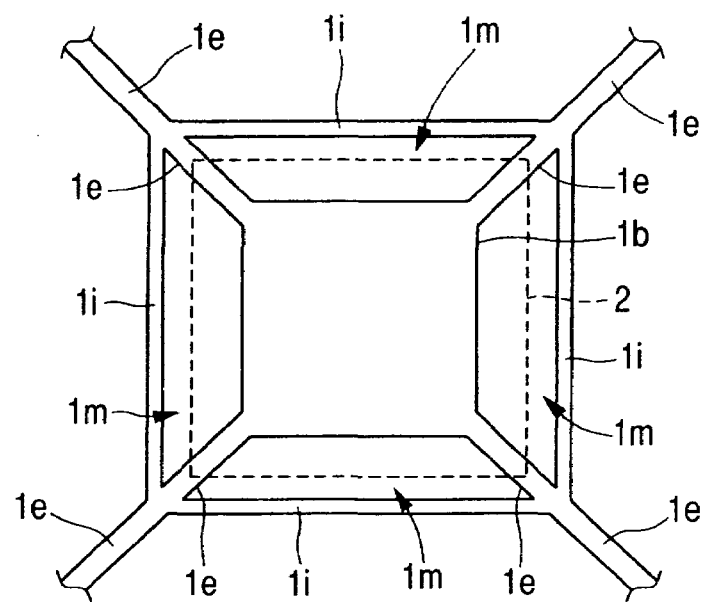
FIG. 3 is a fragmentary plan view showing the relation among a tab, a common lead and a semiconductor chip in the semiconductor device of FIG. 1.
Figure 4:
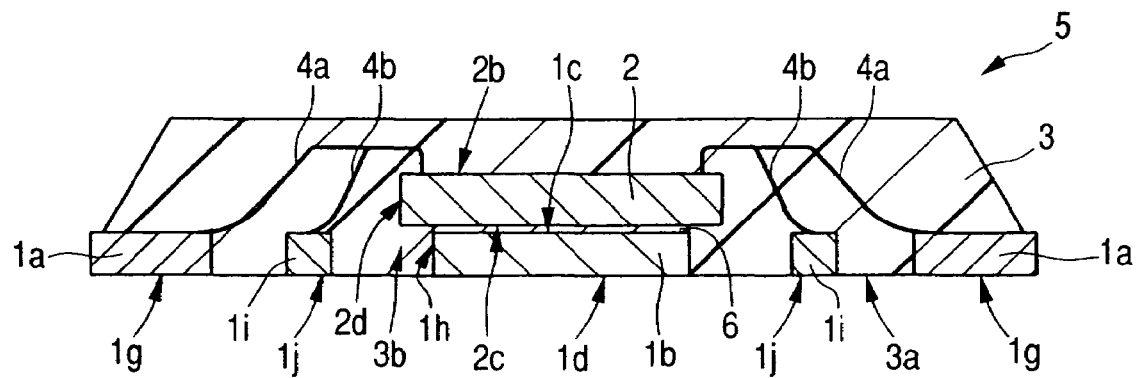
FIG. 4 is a sectional view showing the semiconductor device of FIG. 1.
Figure 5:
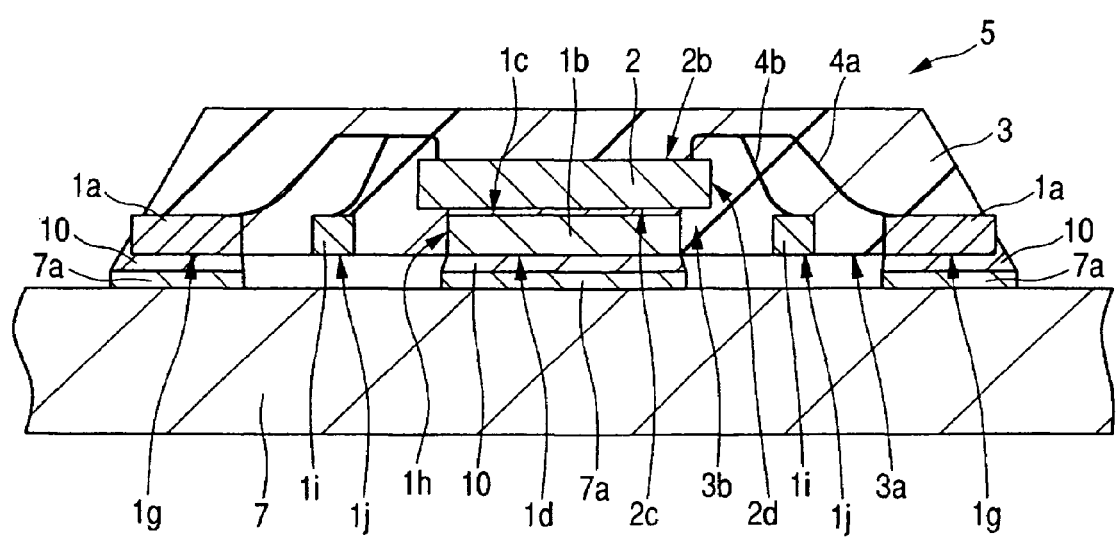
FIG. 5 is a fragmentary sectional view showing the package structure of the semiconductor device of FIG. 1.
Figure 6:
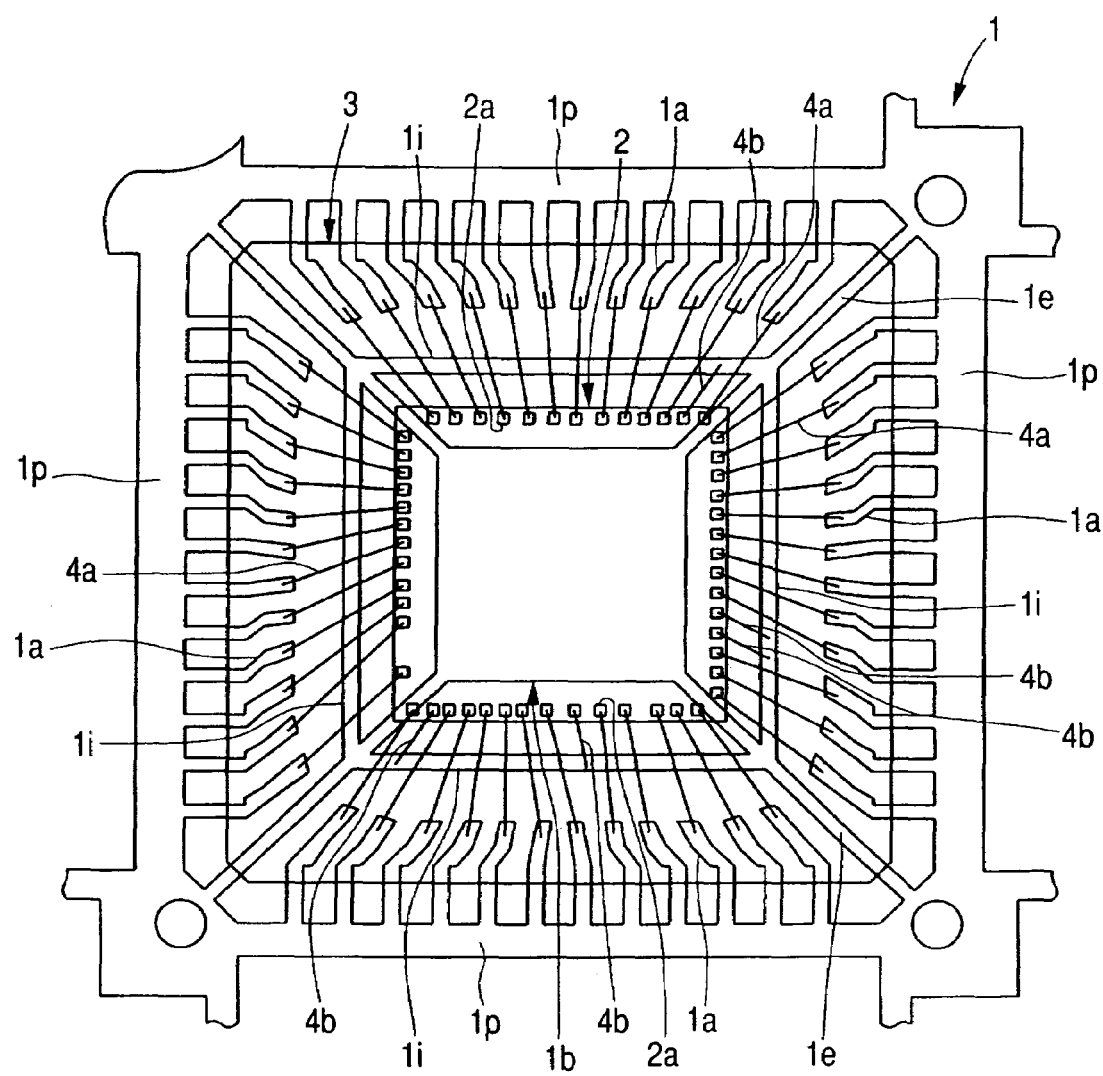
FIG. 6 is a fragmentary plan view showing the wiring structure of the semiconductor device of FIG. 1 as seen through a sealing body.
Figure 7:
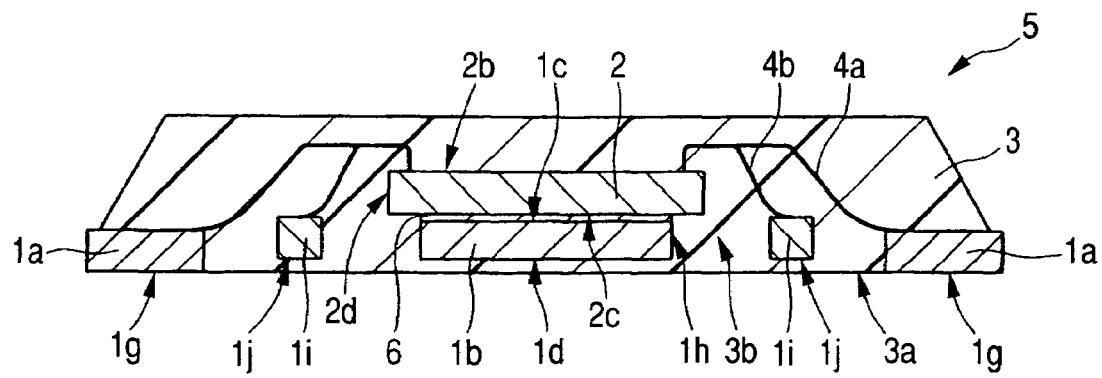
FIG. 7 is a sectional view showing a semiconductor device according to a variation of the first embodiment of the present invention.
Figure 8:
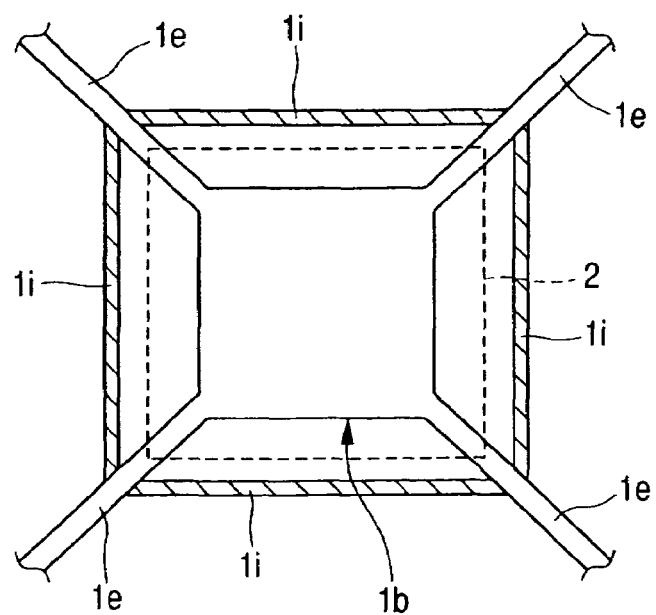
FIG. 8 is a fragmentary plan view showing a half-etched area of a common lead in a semiconductor device according to a variation of the first embodiment of the present invention.
Figure 9:
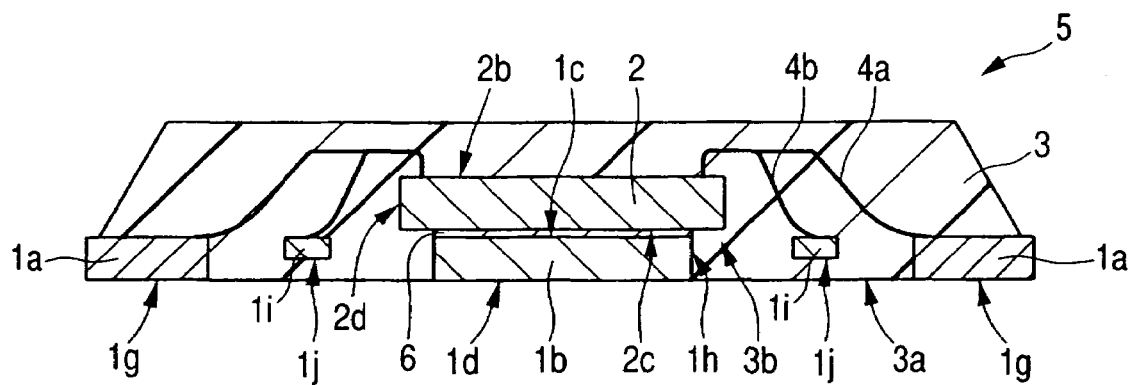
FIG. 9 is a sectional view showing a semiconductor device according to a variation of the first embodiment of the present invention.
Figure 10:
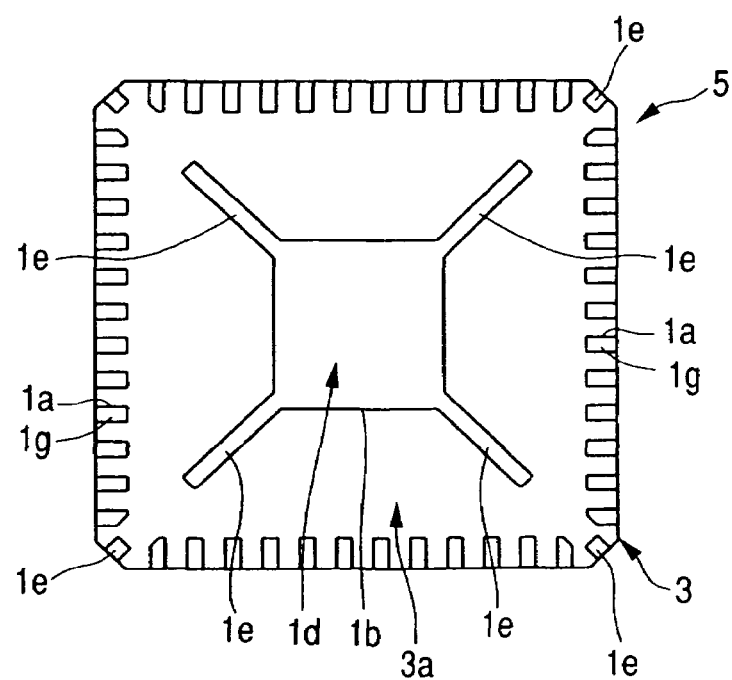
FIG. 10 is a back view showing the semiconductor device of FIG. 9.
Figure 11:
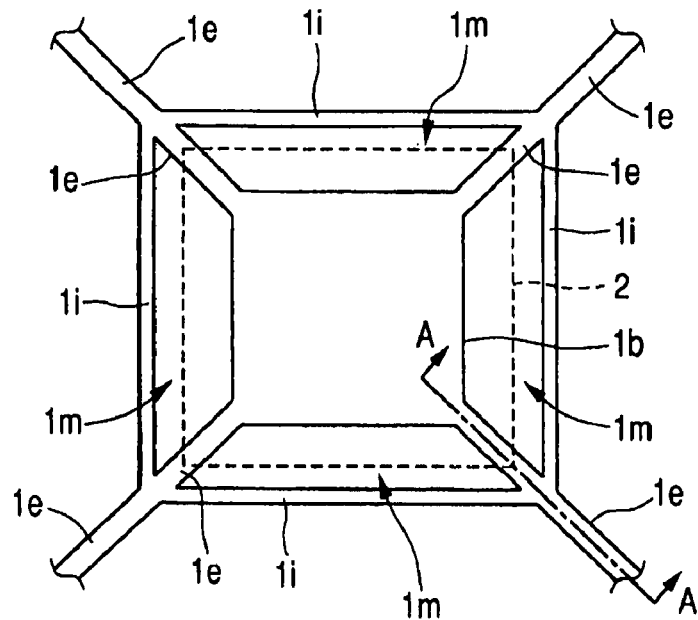
FIG. 11 is a fragmentary plan view showing suspension leads in a semiconductor device according to a variation of the first embodiment of the present invention.
Figure 12:
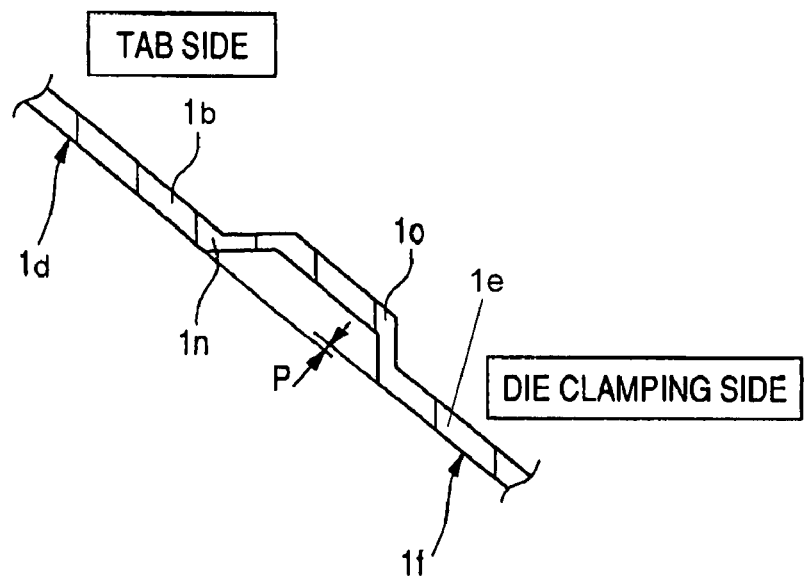
FIG. 12 is a fragmentary sectional view taken along the line A-A of FIG. 11.
Figure 13:
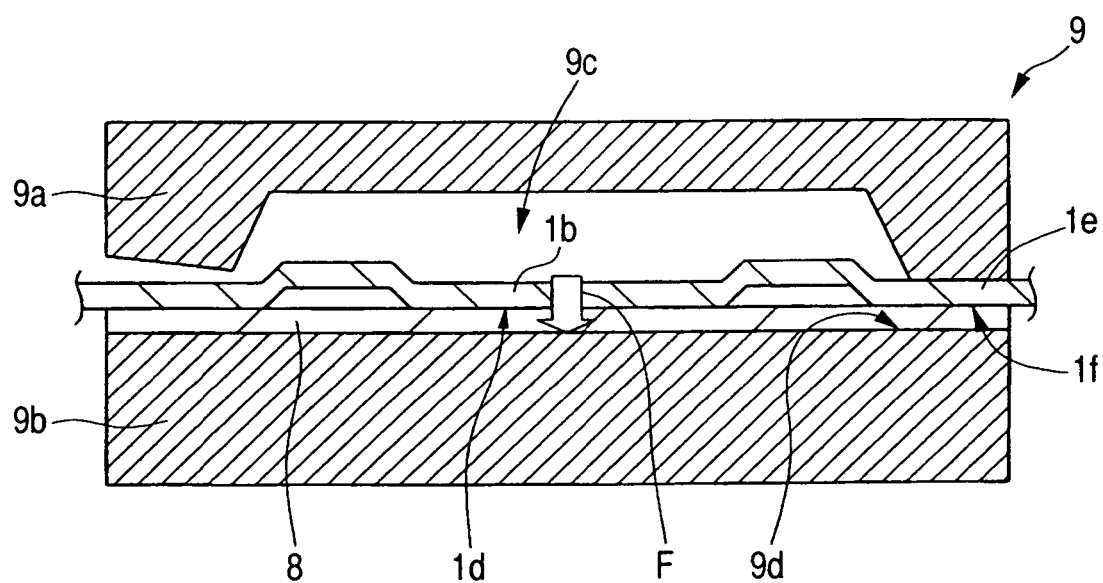
FIG. 13 is a sectional view showing a clamped die in a resin molding process where the suspension leads as shown in FIG. 12 are employed.
Figure 14:
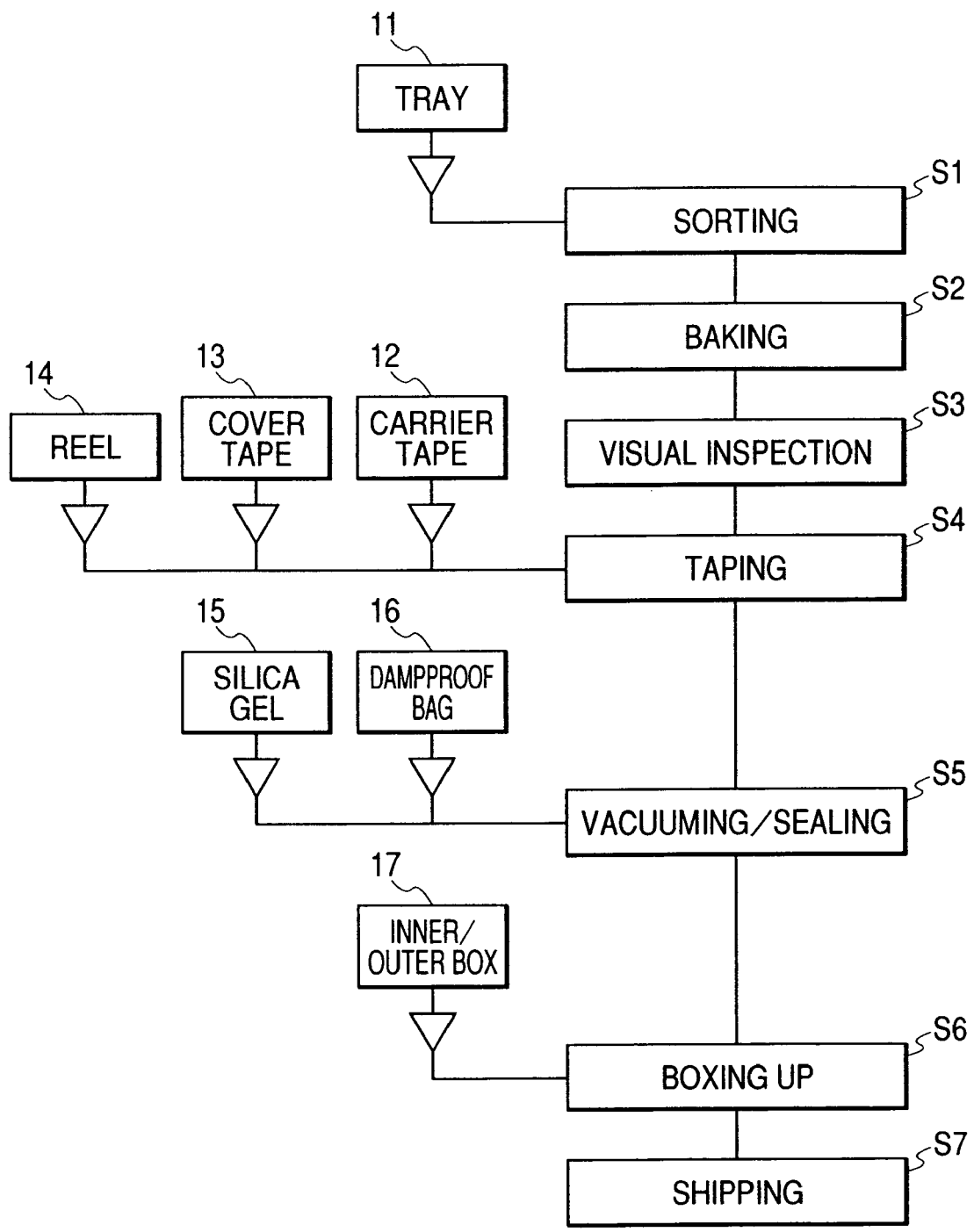
FIG. 14 is a flowchart showing a dampproof packing process in a method of manufacturing a semiconductor device according to the first embodiment of the present invention.
Figure 15:
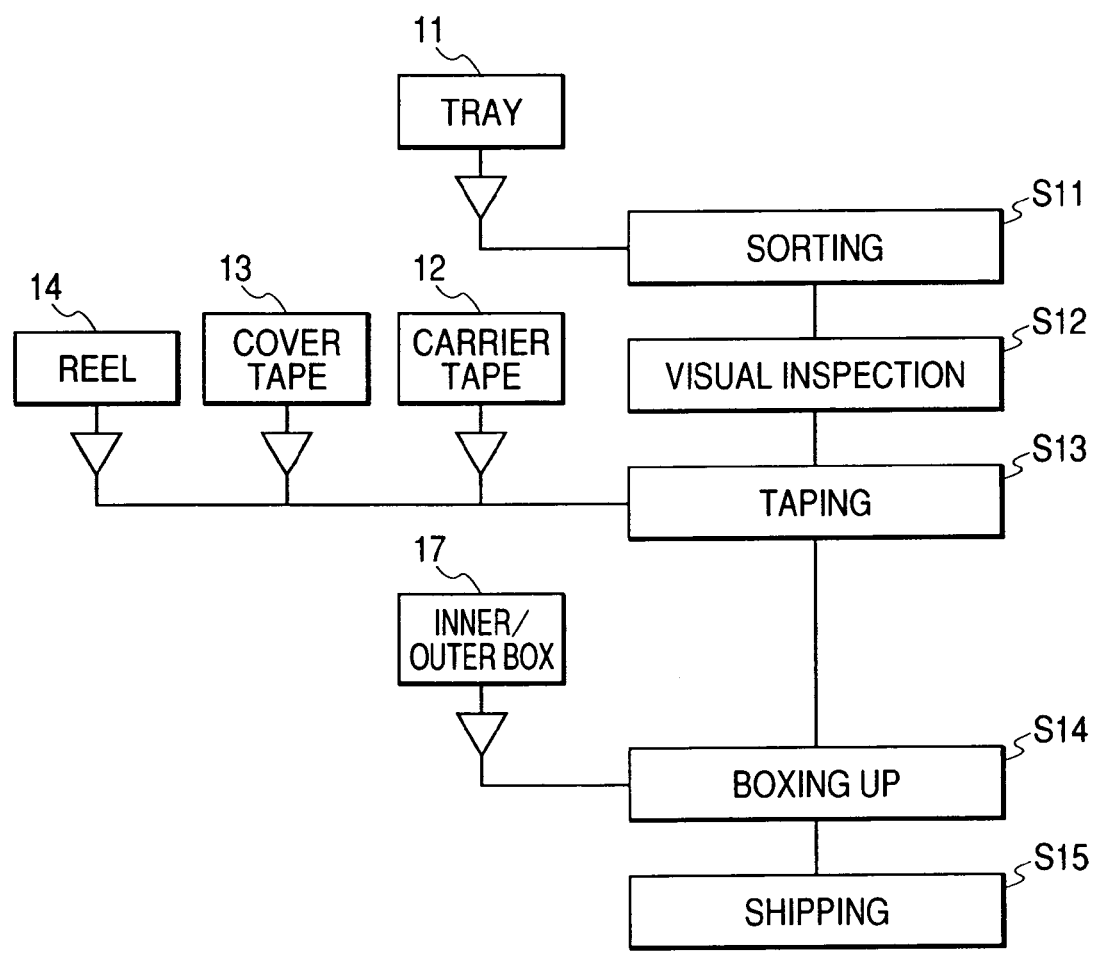
FIG. 15 is a flowchart showing a non-dampproof packing process in a method of manufacturing a semiconductor device according to the first embodiment of the present invention.

FIG. 1 is a plan view showing a semiconductor device according to a first embodiment of the present invention; FIG. 2 is a back view showing the semiconductor device of FIG. 1; FIG. 3 is a fragmentary plan view showing the relation among a tab, a common lead and a semiconductor chip in the semiconductor device of FIG. 1; FIG. 4 is a sectional view showing the semiconductor device of FIG. 1; FIG. 5 is a fragmentary sectional view showing the package structure of the semiconductor device of FIG. 1; FIG. 6 is a fragmentary plan view showing the wiring structure of the semiconductor device of FIG. 1 as seen through a sealing body; FIG. 7 is a sectional view showing a semiconductor device according to a variation of the first embodiment of the present invention; FIG. 8 is a fragmentary plan view showing a half-etched area of a common lead in a semiconductor device according to a variation of the first embodiment of the present invention; FIG. 9 is a sectional view showing a semiconductor device according to a variation of the first embodiment of the present invention; FIG. 10 is a back view showing the semiconductor device of FIG. 9; FIG. 11 is a fragmentary plan view showing suspension leads in a semiconductor device according to a variation of the first embodiment of the present invention; FIG. 12 is a fragmentary sectional view taken along the line A-A of FIG. 11; FIG. 13 is a sectional view showing a clamped die in a resin molding process where the suspension leads as shown in FIG. 12 are employed; FIG. 14 is a flowchart showing a dampproof packing process in a method of manufacturing a semiconductor device according to the first embodiment of the present invention; and FIG. 15 is a flowchart showing a non-dampproof packing process in a method of manufacturing a semiconductor device according to the first embodiment of the present invention.

The semiconductor device according to the first embodiment as shown in FIGS. 1 to 4 is a compact leadless type one in which plural leads 1a are arranged in a line and partially exposed in the peripheral area of a back surface 3a of a sealing body 3. According to the first embodiment, a QFN (semiconductor device) 5 is explained as an example of the above semiconductor device.

As illustrated in FIG. 4, the QFN 5 includes: a semiconductor chip 2 having a semiconductor element and plural pads (electrodes) 2a (see FIG. 6) over its main surface 2b; a tab 1b as a chip mounting plate connected with the semiconductor chip 2; bus bars 1i as a common lead located outside of the semiconductor chip 2 and connected with the tab 1b; a sealing body 3 which resin-seals the semiconductor chip 2; plural leads 1a arranged in a line around the semiconductor chip 2 in a manner that their connected surfaces (partial) 1g are exposed in the peripheral area of the back surface 3a of the sealing body 3; suspension leads 1e which respectively lie in positions corresponding to the four corners of the sealing body 3 and are connected with the tab 1b; plural first wires 4a which connect plural pads 2a of the semiconductor chip 2 and the corresponding plural leads 1a; and plural second wires 4b which connect specific pads 2a of the semiconductor chip 2 with the bus bars 1i. The sealing body 3 has a continuous portion 3b which continues from a side surface 2d of the semiconductor chip 2 to its back surface 2c and further to a side surface 1h of the tab 1b.

In other words, in the QFN 5 according to the first embodiment, the bus bars 1i lie around the semiconductor chip 2 and plural specific pads 2a for grounding (GND) or power supply are connected with the bus bars 1i through the second wires 4b respectively by down-bonding so that the leads 1a are shared and the number of input/output pins is thus decreased for the purpose of more compactness. The bus bars 1i as a common lead are produced, for example, in an etching process where the leads 1a and the suspension leads 1e are also produced.

In the QFN 5, the area of the main surface 1c of the tab 1b is smaller than the area of the main surface 2b of the semiconductor chip 2; in short, the QFN 5 has a small-tab structure. As a semiconductor device with a small-tab structure, the QFN 5 should at least have a continuous portion 3b which continues from the side surface 2d of the semiconductor chip 2 to its back surface 2c and further to the side surface 1h of the tab 1b as illustrated in FIG. 4.

As shown in FIG. 3, slits 1m are provided around the tab 1b and the bus bars 1i lie with the slits 1m interposed. Both ends of each bus bar 1i are connected with suspension leads 1e. In order to permit wire-bonding of each bus bar 1i with the semiconductor chip 2, the bus bar 1i must be located outside of the semiconductor chip 2. The tab 1b is smaller than the semiconductor chip 2 (small-tab structure) Therefore, the periphery of the semiconductor chip 2 lies above the slits 1m and as a result of resin sealing, a continuous portion 3b which continues from the side surface 2d of the semiconductor chip 2 to its back surface 2c to the side surface 1h of the tab 1b will be formed as part of the sealing body 3, as shown in FIG. 4.

In this small-tab structure, part of the sealing body 3 is in tight contact with part of the back surface 2c of the semiconductor chip 2. It is desirable that the area in which a die bonding agent 6 can be put be smaller than the main surface 2b of the semiconductor chip 2. This is because the die bonding agent 6 is highly hygroscopic and easy to come off during a high temperature reflow process. The bonding strength between the sealing body 3 and the lead frame 1 is lower than that between the sealing body 3 and the semiconductor chip 2. If the area of the tab 1b should be larger than the main surface 2b of the semiconductor chip 2, there would be no contact surface between the back surface 2c of the semiconductor chip 2 and the sealing body 3 and it would be difficult to prevent peeling of the semiconductor chip 2. On the other hand, when the area of the tab 1b is smaller than the main surface 2b of the semiconductor chip 2, there is a contact surface between the back surface 2c of the semiconductor chip 2 and the sealing body 3. In this case, the bonding strength between the sealing body 3 and the semiconductor chip 2 is higher than that between the sealing body 3 and the lead frame 1; therefore, even if the die bonding agent 6 comes off, peeling of the semiconductor chip 2 can be prevented because of the existence of the contact surface between the back surface 2c of the semiconductor chip 2 and the sealing body 3.

It is desirable that pads 2a of the semiconductor chip 2 which are connected with the bus bars 1i through the second wires 4b be ground electrodes or power electrodes which can serve as common pins. For example, when a bus bar 1i is connected with a ground pad 2a, ground potential is applied to the bus bar 1i.

As illustrated in FIGS. 2 and 4, in the QFN 5, the back surface id of the tab 1b is exposed on the back surface 3a of the sealing body 3. Hence, when the QFN 5 is mounted on a mounting board 7, the leads 1a and the tab 1b can be connected with a land 7a as an electrode of a mounting board 7 by soldering, as shown in FIG. 5.

As illustrated in FIG. 3, both ends of each bus bar 1i are connected with suspension leads 1e but its other portion, which extends between the suspension leads, is not connected with any other member. In other words, the bus bars 1i are connected with the tab 1b through parts of the suspension leads 1e. As illustrated in FIGS. 2 and 4, the back surface 1d of the tab 1b, the back surfaces 1j of the bus bars 1i, and the back surfaces 1f of parts of the suspension leads 1e are flush with each other and exposed on the same plane as the back surface 3a of the sealing body 3.

As shown in FIG. 4, the semiconductor chip 2 is fixed to the main surface 1c of the tab 1b using a die bonding agent (for example, silver paste) 6 and the back surface 2c of the semiconductor chip 2 and the main surface 1c of the tab 1b are joined through the die bonding agent 6.

The leads 1a arranged in a line in the peripheral area of the back surface 3a of the sealing body 3 of the QFN 5 are partially exposed as connected surfaces 1g on the back surface 3a of the sealing body 3. The connected surfaces 1g are solder-plated or palladium-plated.

The tab 1b, suspension leads 1e and leads 1a are made of sheet metal such as copper alloy sheet metal.

The first wires 4a which connect pads 2a of the semiconductor chip 2 with the corresponding leads 1a, and the second wires 4b which connect ground pads 2a of the semiconductor chip 2 with the bus bars 1i are, for example, gold wires.

The sealing body 3 is formed by resin molding. The sealing resin used in resin molding is, for example, thermosetting epoxy resin.

In the QFN 5 according to the first embodiment, since the sealing body 3 has a continuous portion 3b which continues from the side surface 2d of the semiconductor chip 2 to its back surface 2c to the side surface 1h of the tab 1, the degree of adhesion among the semiconductor chip 2, the tab 1b, and the sealing body 3 is increased.

In other words, since the QFN 5, provided with the bus bars 1i, has a small-tab structure (the tab 1b bearing the semiconductor chip 2 is smaller than the semiconductor chip 2), the risk that the tab 1 peels off the sealing body 3 during a high-temperature reflow process is prevented. Hence, stress on the bus bars 1i in a temperature cycle test is reduced and disconnection of the second wires 4b in the wire connections of the bus bars 1i is prevented.

As a consequence, the reflow resistance of the QFN 5 is increased and its quality is improved.

Since the reflow resistance of the QFN 5 is improved, a reflow process can be done at high temperature (260° C.). This permits Pb-free packaging.

In other words, as shown in FIG. 5, the QFN 5 can be mounted on the mounting board 7 using Pb-free solder 10. The Pb-free solder 10 is, for example, tin-silver-copper alloy solder.

However, it is also acceptable to use Pb solder for mounting the QFN 5 on the mounting board 7.

In the QFN 5, both ends of each bus bar 1i are connected with suspension leads 1e but its other portion, which extends between the suspension leads, is not connected with any other member. In other words, since the bus bars 1i are only connected with the suspension leads 1e, even if peeling occurs between the tab 1b and the sealing body 3, it is possible to stop spread of the peeling to the bus bars 1i and thereby prevent disconnection of the second wires 4b in the bus bars 1i.

In the QFN 5, it is desirable that the suspension leads 1e have the same thickness as the exposed portions (which include the connected surfaces 1g) of the leads 1a on the back surface 3a of the sealing body 3. In short, preferably the suspension leads 1e should not be thinned by half-etching or a similar process. As a result, deterioration in the rigidity of the suspension leads 1e will be prevented, and for the structure in which the tab 1b is exposed on the back surface 3a of the sealing body 3, in a resin sealing process, the tab 1b can be strongly pressed against a film sheet (sealing sheet) 8 placed on a die surface 9d of a lower mold 9b of a resin mold die 9 as shown in FIG. 13, so that resin sealing (transfer molding) is performed with tab 1b in tight contact with the film sheet 8 and consequently no resin burrs are generated on the back surface 1d of the tab 1b.

In resin molding, it is also acceptable to perform resin sealing in a manner to cover plural device areas collectively.

Next, a variation of the first embodiment will be explained.

FIG. 7 shows a small-tab structure in which the tab 1b and the bus bars 1i are not exposed but embedded in the sealing body 3. In this case, the wires can be arranged in areas corresponding to the tab 1b and bus bars 1i, on the back surface 3a of the sealing body 3, so that the packaging efficiency for the QFN 5 can be improved.

In the variation as shown in FIGS. 8 to 10, the back surfaces 1j of the bus bars 1i (opposite to the chip mounting side) are half-etched. In other words, the reverse faces 1j of the bus bars 1i (hatched in FIG. 8) are made thinner than, for example, the exposed portions of the leads 1a on the back surface 3a of the sealing body 3 (portions of the leads 1a including the connected surfaces 1g) by half-etching or a similar process. In this structure, sealing resin gets into the spaces beneath the back surfaces 1j of the bus bars 1i during a resin sealing process; consequently, the resin sealing body 3 is formed as shown in FIG. 9 where some resin fills the spaces beneath the back surfaces 1j of the bus bars 1i.

When the bus bars 1i are thin, their rigidity is low; therefore, as the sealing body 3 warps, the bus bars 1i can warp, following the sealing body 3. Besides, some resin of the sealing body 3 fills the spaces beneath the back surfaces 1j of the bus bars 1i, thereby increasing the degree of adhesion between the sealing body 3 and the bus bars 1i (resin lock effect).

This reduces stress generated in the bus bars 1i and prevents peeling between the bus bars 1i and the sealing body 3. As a result, disconnection of the second wires 4 in the bus bars 1i is prevented and the quality of the QFN 5 is improved.

In the QFN 5 structure in which the back surfaces 1j of the bus bars 1i are half-etched, the bus bars 1i are embedded in the sealing body 3 (not exposed on its back surface 3a) as illustrated in FIG. 10.

In a variation as shown in FIGS. 11 and 12, the back surface 1d of the tab 1b is protruded by amount P (FIG. 12) toward the back surface of the tab 1b from the plane in which the resin mold die 9 is clamped for resin-sealing the suspension leads 1e. For example, in an area outside the intersection of a suspension lead 1e and a bus bar 1i, a bend 1n toward the chip mounting side (front side) of the suspension lead 1e and a bend 1o toward the opposite direction (back side) are made. Here, the step produced by the bend 1n at the tab side is larger by amount P than the step produced at the die clamping side (step level difference) so that the back surface 1d of the tab 1b protrudes backward by amount P from the plane (back surface 1f) in which the resin mold die 9 is clamped.

Accordingly, as shown in FIG. 13, when the suspension leads 1e are clamped by the resin mold die 9 for resin sealing, a spring force is generated due to the step level difference of the bend in of each suspension lead 1e, resulting in force F which presses the tab 1b backward. Therefore, resin sealing is performed while the back surface 1d of the tab 1b is in tight contact with the film sheet 8 placed on the die surface 9d of the resin mold die 9.

Alternatively, the retention of the suspension leads 1e can be improved by increasing the number of bends 1n (FIG. 12) rather than making a step in the bend 1n.

When the amount of step level difference is just P, the suspension leads 1e may be exposed on the back surface 3a of the sealing body 3. If the suspension leads 1e should be exposed in the vicinity of the tab 1b, the leads 1e might be short-circuited with the leads 1a during soldering for mounting on the mounting board 7. Therefore, the step of the bend 1n in the vicinity of the tab 1b should be large enough (FIG. 12) so that the leads 1e are not exposed on the back surface 3a of the sealing body 3. Short-circuiting with the leads 1a is thus prevented.

As a consequence, the risk that resin burrs are generated on the back surface 1d of the tab 1b is avoided.

The bus bars 1i provide a common grounding means. In addition, the tab 1b connected with the bus bars 1i is mounted on the mounting board 7 for the QFN 5 by directly soldering it to the land 7a of the mounting board 7 as a large grounding area, so the ground potential is strengthened or stabilized, which offers a further advantage for a high-frequency version of the QFN 5.

Next, a method of manufacturing the QFN 5 according to the first embodiment will be explained.

First, a lead frame 1 as shown in FIG. 6 is prepared. This lead frame 1 includes: a tab 1b which can bear a semiconductor chip 2; suspension leads 1e which support the tab 1b at its corners; bus bars 1i which are connected with the tab 1b through parts of the suspension leads 1e and located outside of the tab 1b; and plural leads 1a arranged around the tab 1b. In the lead frame 1, the leads 1a, suspension leads 1e, tab 1b and bus bars 1i are inside a square area formed by four frame edges 1p (one device area).

Then, a die bonding step is taken. In the die bonding step, the semiconductor chip 2 is fixed to the main surface 1c of the tab 1b as a chip mounting plate in the lead frame 1 using a die bonding agent 6.

Then, a wire bonding step is taken. As shown in FIG. 6, pads 2a of the semiconductor chip 2 are connected with the corresponding leads 1a through first wires 4a (gold wires) and pads 2a of the semiconductor chip 2 for grounding (or power supply) are connected with the bus bars 1i through second wires 4b (gold wires, etc).

Then, a resin sealing (resin molding) step is taken. As shown in FIG. 4, at this step, a continuous portion of sealing resin 3b which continues from the side surface 2d of the semiconductor chip 2 to its back surface 2c to the side surface 1h of the tab 1b is formed, and also as shown in FIG. 2, the semiconductor chip 2, first wires 4a and second wires 4b are resin-sealed to form a resin sealing body 3 in such a way that the plural leads 1a are partially exposed in the peripheral area of the back surface 3a of the resin sealing body 3.

In case that a bend in as shown in FIG. 12 is made in each suspension lead 1e, when the suspension leads 1e are clamped between the upper mold 9a and lower mold 9b of the resin mold die 9 as shown in FIG. 13, a spring force is generated due to the step level difference of the bend in of each suspension lead 1e, resulting in force (F) which presses the tab 1b backward. Therefore, during resin sealing, the back surface 1d of the tab 1b and the connected surfaces 1g of the leads 1a are in tight contact with the film sheet 8 placed on the die surface 9d of the lower mold 9b of the resin mold die 9.

Under this condition, sealing resin is supplied into a cavity 9c of the resin mold die 9 for resin molding. Because the connected surfaces 1g of the leads 1a and the back surface 1d of the tab 1b are in tight contact with the film sheet 8, no resin burrs are generated on the connected surfaces 1g of the leads 1a and the back surface id of the tab 1b.

After resin sealing is finished, the leads are cut. The leads 1a and suspension leads 1e are cut from the edges 1p of the lead frame 1 (FIG. 6) to make a separate package.

Next, how the semiconductor device according to the first embodiment is packed for shipment will be explained.

According to the first embodiment, the QFN 5 features improved reflow resistance, so a high-temperature reflow process can be carried out and non-dampproof packing is acceptable. In other words, because of the improved reflow resistance, even if there is some moisture absorption, it is possible to prevent the tab 1b and leads 1a (including the bus bars 1i) from peeling off the sealing body 3. Hence, a product packed in a non-dampproof manner may be shipped, though a dampproof-packed product may also be shipped.

First, a dampproof packing process is explained with reference to FIG. 14.

After assembly of QFN 5 is finished, sorting is done (step S1) and the QFN 5 is housed in a prescribed tray 11.

After the sorting step, baking is done (step S2). At this step, moisture of the QFN 5 is removed by baking.

After the baking step, a visual inspection is made (step S3). At this step, the appearance of the QFN 5 is checked.

After the visual inspection step, taping is done (step S4). At this step, the QFN 5 is loaded onto carrier tape 12, taped with cover tape 13 and wound around a reel 14.

After the taping step, vacuuming and sealing are done (step S5). At this step, carrier tape 12 carrying the QFN 5 is put in a dampproof bag 16 together with silica gel (desiccant) 15 and the dampproof bag 16 is vacuumed and thermally sealed.

After thermal sealing, boxing up is done (step S6). Specifically, the dampproof bag 16 containing the QFN 5 is put in an inner/outer box 17.

After that, shipment is made (step S7). Namely, the boxed QFN 5 is shipped.

Next, a non-dampproof packing process will be explained with reference to FIG. 15.

The non-dampproof packing process is the same as the dampproof packing process of FIG. 14 except that either the baking step (S2) or the vacuuming/sealing step (S5) or both are omitted; namely the other steps (sorting S11, visual inspection S12, taping S13, boxing up S14 and shipping S15) are the same as in the dampproof packing process.

As stated above, according to the first embodiment, the QFN 5 features improved reflow resistance and thus the packing process maybe dampproof or non-dampproof. However, since the baking and vacuuming/sealing steps are omitted in the non-dampproof packing process (FIG. 15), the non-dampproof packing process is more advantageous in terms of production cost reduction and labor saving.

In addition, the QFN 5 permits Pb-free packaging. After the QFN 5 packed in a non-dampproof manner is shipped and unpacked by a customer, it may be used for Pb-free packaging. Therefore, the customer can enjoy the benefits of cost reduction and handling ease.

SECOND EMBODIMENT

Figure 16:
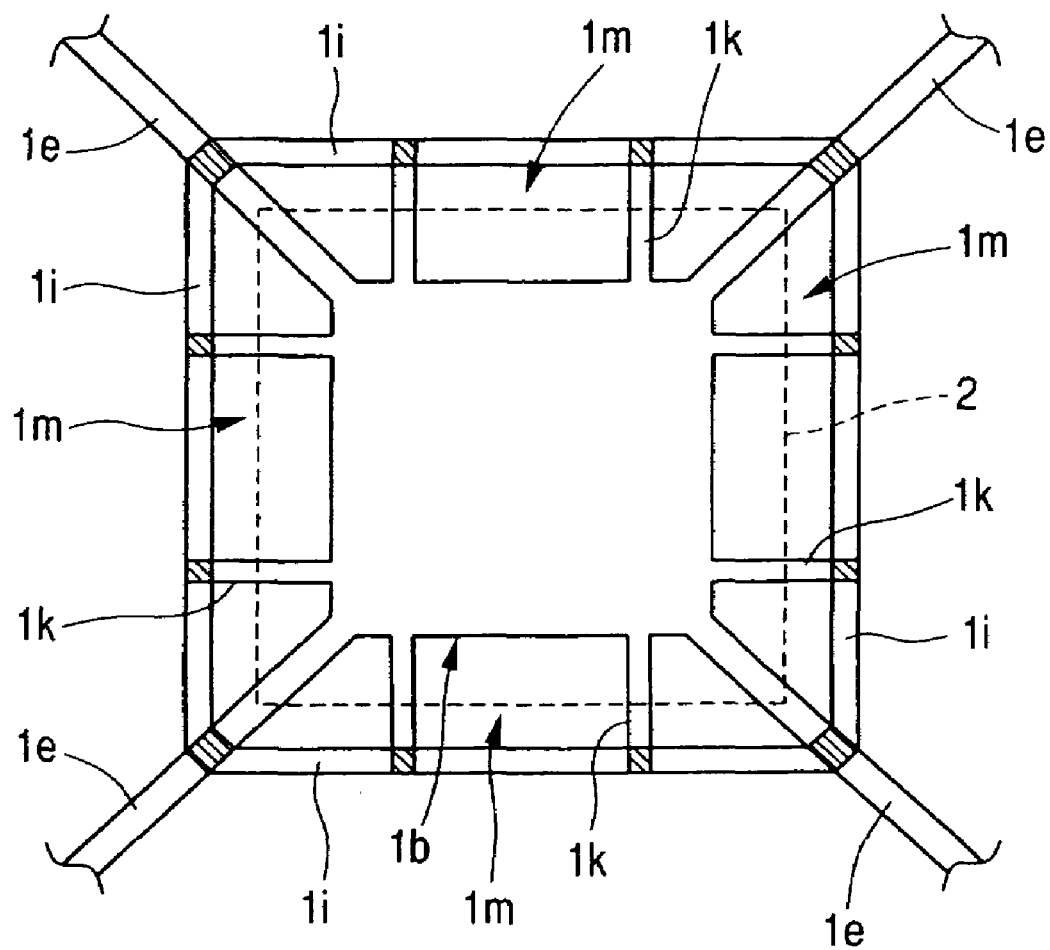
FIG. 16 is a fragmentary plan view showing the relation among a tab, a common lead and a semiconductor chip in s semiconductor device according to a second embodiment of the present invention.
Figure 17:
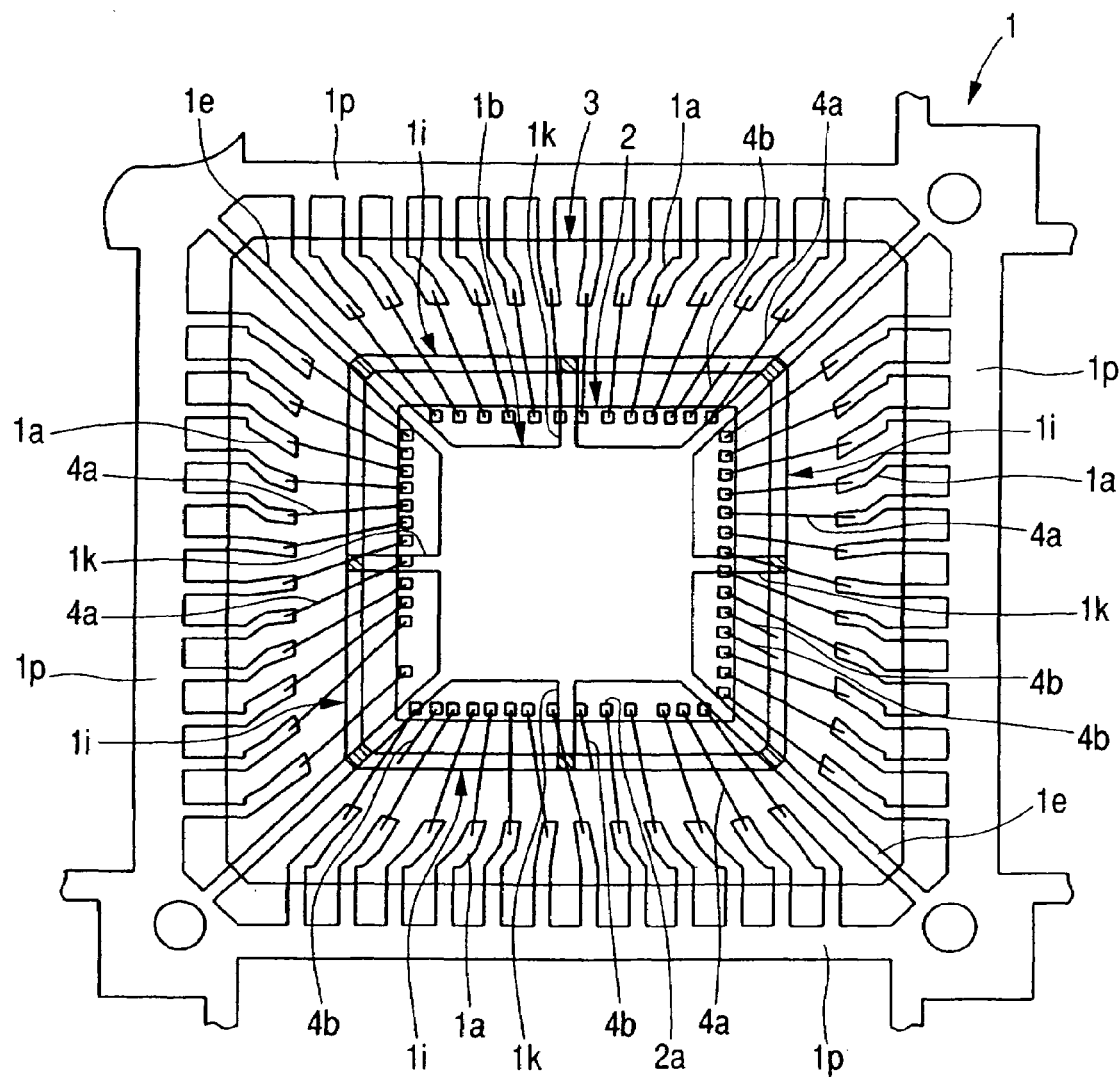
FIG. 17 is a fragmentary plan view showing the wiring structure of the semiconductor device according to the second embodiment of the present invention as seen through a sealing body.
Figure 18:
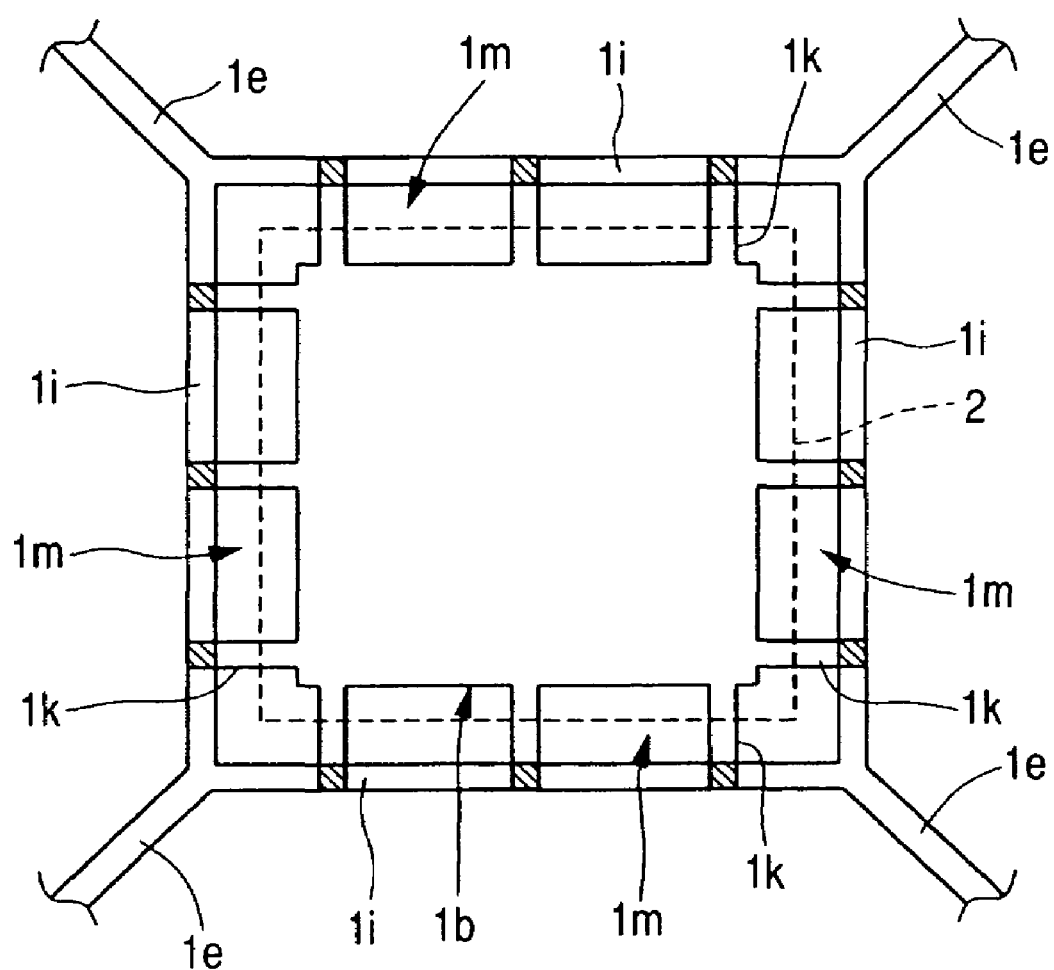
FIG. 18 is a fragmentary plan view showing the relation among a tab, a common lead and a semiconductor chip in a semiconductor device according to a variation of the second embodiment of the present invention.

FIGS. 16 to 18 concern a semiconductor device according to the second embodiment of the present invention, in which FIG. 16 is a fragmentary plan view showing the positional relation among a tab, a common lead and a semiconductor chip in a semiconductor device; FIG. 17 is a fragmentary plan view of the wiring structure of the semiconductor device as seen through a sealing body; and FIG. 18 is a fragmentary plan view showing the positional relation among a tab, a common lead and a semiconductor chip in a variation of the second embodiment.

The semiconductor device according to the second embodiment are the same as the QFN 5 according to the first embodiment except that the pattern of connection of the bus bars as common leads and the tab 1b is different from that in the first embodiment.

In a structure as shown in FIGS. 16 and 17, each bus bar 1i is connected with suspension leads 1e at both ends and also its portion between the suspension leads 1e is directly connected with the tab 1b by one or more connecting portions 1k.

In this structure, second wires 4b are connected with portions of the bus bars 1i other than their intersections with the connecting portions 1k and suspension leads 1e (hatched) as shown in FIG. 17.

In this structure, even if peeling occurs between the tab 1b and the sealing body 3 and this peeling spreads through a connecting portion 1k to a bus bar 1i, disconnection of the second wires 2 in the bus bars 1i do not occur because the second wires 4b are not connected with the above bus bar intersections with the connecting portions 1k and suspension leads 1e.

In a variation of the second embodiment as shown in FIG. 18, the bus bars 1i are connected with the tab 1b only through the connecting portions 1k and the tab 1b is not directly connected with the suspension leads 1e and supported only by the bus bars 1i.

The second embodiment and its variation as shown in FIGS. 16 to 18 bring about almost the same effects as the QFN 1 as shown in FIG. 1. Specifically, even if peeling spreads from the tab 1 through a connecting portion 1k to a bus bar 1i, the absence of a connected wire in the intersection prevents wire disconnection. Hence, the second embodiment improves reflow resistance like the first embodiment (QFN 5).

Since the bus bars 1*i* are connected with the tab 1*b* through the connecting portions 1*k*, the location of the bus bars 1*i* is stabilized in the assembly process, making semiconductor device assembly work easier.

So far, preferred embodiments of the invention made by the inventors have been concretely described. However, obviously the present invention is not limited to the above embodiments but may be embodied in other various forms without departing from the scope and spirit thereof.

Although the above first and second embodiments concern QFN type semiconductor devices, the present invention may be applied to other types of semiconductor devices as far as they have bus bars 1*i* and are of the leadless type where the bus bars 1*i* are down-bonded.

In the abovementioned variation of the first embodiment, the bus bars 1*i* are thinned by a half-etching technique. However, other techniques of thinning such as press work and coining may be employed. In the above first embodiment, the back surfaces 1*j* of the bus bars 1*i* of the QFN 5 are half-etched in the process of manufacturing the lead frame 1.

The present invention is useful for electronic equipment and semiconductor device manufacturing technology.

What is claimed is:

1. A method of manufacturing a semiconductor device comprising the steps of:
   (a) preparing a lead frame including a chip mounting plate, a common lead connected with, and located outside of, the chip mounting plate, and a plurality of leads arranged around the chip mounting plate;
   (b) mounting a semiconductor chip over the chip mounting plate;
   (c) connecting first electrodes of the semiconductor chip with corresponding leads through first wires;
   (d) connecting second electrodes of the semiconductor chip with the common lead through second wires;
   (e) forming a sealing body which resin-seals the semiconductor chip, the first wires, and the second wires, the sealing body having a continuous portion of sealing resin which extends from a side surface of the semiconductor chip to a back surface of the semiconductor chip, and from the back surface of the semiconductor for chip to a side surface of the chip mounting plate, with the plurality of leads being partially exposed from a back surface of the sealing body; and
   (f) cutting the plurality of leads from the lead frame to make a separate package;
   wherein the lead frame includes suspension leads connected with the chip mounting plate;
   wherein, in the step (a), the lead frame is prepared such that a back surface of the chip mounting plate protrudes backward relative to back surfaces of the suspension leads; and
   wherein the step (e) includes placing a sealing sheet over a die surface of a resin mold die, and resin sealing is performed in a manner that the suspension leads are clamped over the die surface with the back surface of the chip mounting plate pressing against the sealing sheet.

2. The method of manufacturing a semiconductor device according to claim 1, wherein each said suspension lead has a bend toward a chip mounting side and a bend toward an opposite direction outside an intersection of the suspension lead with the common lead.

3. The method of manufacturing a semiconductor device according to claim 1, further comprising, after the step (f), the steps of:
   (g) sorting the semiconductor device;
   (h) after the step (g), making a visual inspection of the semiconductor device without baking the device;
   (i) putting the semiconductor device in a case;
   (j) putting the case containing the semiconductor device in a dampproof bag together with desiccant, then thermally sealing the bag;
   (k) boxing up the dampproof bag containing the semiconductor device; and
   (l) shipping the boxed semiconductor device.

4. The method of manufacturing a semiconductor device according to claim 1, further comprising, after the step (f), the steps of:
   (g) sorting the semiconductor device;
   (h) baking the semiconductor device;
   (i) after the step (h), making a visual inspection of the semiconductor device;
   (j) putting the semiconductor device in a case;
   (k) putting the case containing the semiconductor device in a dampproof bag without desiccant, then thermally sealing the bag;
   (l) boxing up the dampproof bag containing the semiconductor device; and
   (m) shipping the boxed semiconductor device.

5. The method of manufacturing a semiconductor device according to claim 1, further comprising, after the step (f), the steps of:
   (g) sorting the semiconductor device;
   (h) baking the semiconductor device;
   (i) after the step (h), making a visual inspection of the semiconductor device;
   (j) putting the semiconductor device in a case;
   (k) boxing up the case containing the semiconductor device without putting the device in a dampproof bag; and
   (m) shipping the boxed semiconductor device.

6. The method of manufacturing a semiconductor device according to claim 1, further comprising, after the step (f), the steps of:
   (g) sorting the semiconductor device;
   (h) after the step (g), making a visual inspection of the semiconductor device without baking the device;
   (i) putting the semiconductor device in a case;
   (j) boxing up only the case containing the semiconductor device; and
   (k) shipping the boxed semiconductor device.

7. The method of manufacturing a semiconductor device according to claim 6, wherein, after the step (k), the semiconductor device is taken out of the case and mounted over a mounting board using Pb-free solder.

8. A method of manufacturing a semiconductor device comprising the steps of:
   (a) preparing a lead frame including a chip mounting plate, a common lead connected with, and located outside of, the chip mounting plate, and a plurality of leads arranged around the chip mounting plate;
   (b) mounting a semiconductor chip over the chip mounting plate;
   (c) connecting first electrodes of the semiconductor chip with the corresponding leads through first wires;
   (d) connecting first electrodes of the semiconductor chip with the common lead through second wires;
   (e) forming, a sealing body which resin-seals the semiconductor chip, the first wires, and the second wires, the sealing body having a continuous portion of sealing resin which extends from a side surface of the semiconductor chip to a back surface of the semiconductor chip, and from the back surface of the semiconductor chip to a side surface of the chip mounting plate, with the plurality of leads and the chip mounting plate being partially exposed from a back surface of the sealing body; and (f) cutting the plurality of leads from the lead frame to make a separate package.

9. The method of manufacturing a semiconductor device according to claim 8, wherein the common lead is partially exposed from the back surface of the sealing body.

10. The method of manufacturing a semiconductor device according to claim 9, wherein the plurality of leads, the common lead, and the chip mounting plate have back surface portions disposed in a common plane.

11. The method of manufacturing a semiconductor device according to claim 8, wherein the plurality of leads and the chip mounting plate have back surface portions disposed in a common plane.

12. The method of manufacturing a semiconductor device according to claim 8,
wherein the lead frame includes suspension leads connected with the chip mounting plate;
wherein, in the step (a), the lead frame is prepared such that a back surface of the chip mounting plate protrudes backward relative to back surfaces of the suspension leads; and
wherein the step (e) includes placing a sealing sheet over a die surface of a resin mold die, and resin sealing is performed in a manner that the suspension leads are clamped over the die surface with the back surface of the chip mounting plate pressing against the sealing sheet.

13. The method of manufacturing a semiconductor device according to claim 12, wherein each suspension lead has a bend toward a chip mounting side and a bend toward an opposite direction outside an intersection of the suspension lead with the common lead.

* * * * *